US012803306B2

(12) United States Patent
De Brito et al.

(10) Patent No.: US 12,803,306 B2
(45) Date of Patent: Nov. 17, 2026

(54) SYSTEM AND METHOD FOR MONITORING THE CONNECTION OF BATTERY TERMINALS TO AN ELECTRICAL SYSTEM OF A MOTOR VEHICLE, AND MOTOR VEHICLE COMPRISING SUCH MONITORING SYSTEM

(71) Applicant: VOLVO TRUCK CORPORATION, Gothenburg (SE)

(72) Inventors: David De Brito, Charvieu (FR); Frederic Leroy, Lyons (FR)

(73) Assignee: VOLVO TRUCK CORPORATION, Gothenburg (SE)

( * ) Notice: Subject to any disclaimer, the term of this patent is extended or adjusted under 35 U.S.C. 154(b) by 783 days.

(21) Appl. No.: 18/328,997

(22) Filed: Jun. 5, 2023

(65) Prior Publication Data

US 2023/0402859 A1 Dec. 14, 2023

(30) Foreign Application Priority Data

Jun. 10, 2022 (EP) .................................... 22178475

(51) Int. Cl.
*H02J 7/60* (2026.01)
*B60R 16/033* (2006.01)
(Continued)

(52) U.S. Cl.
CPC ............ *H02J 7/685* (2026.01); *B60R 16/033* (2013.01); *G01R 17/02* (2013.01); *G01R 31/364* (2019.01); *G01R 31/3646* (2019.01)

(58) Field of Classification Search
CPC .......... H02J 7/685; H02J 7/80; H02J 2105/37; B60R 16/033; G01R 17/02; G01R 31/364; G01R 31/3646
See application file for complete search history.

(56) References Cited

U.S. PATENT DOCUMENTS 6,194,877 B1 * 2/2001 Judge ........................ H02J 7/14 320/162
2005/0151559 A1 * 7/2005 Liao ..................... G01R 31/382 307/64

(Continued)

FOREIGN PATENT DOCUMENTS

JP 2010246285 A 10/2010

OTHER PUBLICATIONS

European Search Report in corresponding European Application No. 22178475.4 dated Nov. 23, 2022 (2 pages).

*Primary Examiner* — Pinping Sun
(74) *Attorney, Agent, or Firm* — Jeffri A. Kaminski; Venable LLP

(57) ABSTRACT

A system for monitoring the connection of the terminals of a battery which is suitable to be connected and provide auxiliary electrical power to an onboard electrical distribution system of a motor vehicle includes an electronic control unit; a sensor to be connected to at least one of the terminals of the battery and to provide in input to the electronic control unit signals indicative of the electric power currently generated by the battery. The electronic control unit is configured, based on the signals received in input:

to monitor and compare an electrical parameter of the electric power currently generated by the battery with a predefined reference condition which is indicative of a correct connection of the terminals; to output an alert signal indicative of an incorrect connection of at least one of the terminals of the battery to the onboard electrical distribution system when the electrical parameter monitored exceeds the predetermined reference condition.

7 Claims, 4 Drawing Sheets

(51) Int. Cl.

| | |
|---|---|
| ***G01R 17/02*** | (2006.01) |
| ***G01R 31/36*** | (2020.01) |
| ***G01R 31/364*** | (2019.01) |

(56) References Cited

U.S. PATENT DOCUMENTS

| | | | | |
|---|---|---|---|---|
| 2005/0258796 | A1 | 11/2005 | Kusaka | |
| 2015/0021986 | A1* | 1/2015 | Takikita | B60L 3/0046<br>307/10.7 |
| 2016/0244009 | A1* | 8/2016 | Demmerle | B60R 16/033 |
| 2021/0143663 | A1* | 5/2021 | Bolton | H01M 10/052 |
| 2022/0407338 | A1* | 12/2022 | Li | G01R 31/382 |

* cited by examiner

SYSTEM AND METHOD FOR MONITORING THE CONNECTION OF BATTERY TERMINALS TO AN ELECTRICAL SYSTEM OF A MOTOR VEHICLE, AND MOTOR VEHICLE COMPRISING SUCH MONITORING SYSTEM

TECHNICAL FIELD

The present disclosure relates generally to the field of monitoring the proper functioning of batteries, and in particular to a system and a method for monitoring the connection of battery terminals to an electrical system of a motor vehicle, and to a motor vehicle, in particular a truck, comprising such monitoring system.

The system and method according to the disclosure are particularly suitable for being applied to trucks and will be described hereinafter by making specific reference to such application, without intending in any way to limit their possible application to other types of motor vehicles.

BACKGROUND

As known, modern motor vehicles, such as trucks, are equipped more and more with devices and systems which consume non negligible amounts of electric power.

Hence, it is important for such vehicles to have an adequate electric distribution system which is capable, as a whole, to feed the on-board powerful and greedy electrical consumers in the various operating conditions.

For example, usually the alternator of a motor vehicle provides the electrical supply to all electrical equipment in driving conditions, i.e. when the engine is on.

However, the alternator can get overloaded if many electrical components are used simultaneously and/or intensively, especially for heavy vehicles, such as trucks.

To face this issue, motor vehicles, and in particular trucks, are provided with a redundant power source, constituted for instance by one or more batteries installed on board.

Hence, in such situations, the additional power requirement is compensated by the battery(ies) installed on board.

Although such solution provides beneficial effects to the entire electrical distribution system installed on board, there are still some aspects worth of further improvements.

In fact, if a battery is lost or does not operate correctly, an important consumption of electrical current, not properly and timely supported by such battery, can cause the on-board electrical network to collapse, which is obviously problematic, especially if for example a truck is travelling on the road.

This dangerous condition can happen for example when the terminals of the battery are not properly connected or tightened to the associated power cables of the on-board electrical system.

In particular, while such circumstance is unlikely to occur when a motor vehicle like a truck is manufactured, since at that time the battery terminals are tightened with proper tools that enable to control the tightening torque, and in any case such operations are subject to adequate quality controls by the manufacturer, during lifetime, i.e. at the time of replacing the battery(ies), it is possible that some truck owners replace a battery by themselves without using a proper tightening tool.

As a consequence, this may result in an improper connection of the battery terminals and subsequently in some malfunctioning or even complete failures of the battery during travelling.

SUMMARY

The present disclosure is aimed at facing such issues, and in particular at providing a solution capable of at least mitigating the consequences of a poor or improper connection of the terminals of any battery installed onboard of a motor vehicle, and in particular on a truck.

This aim is achieved by a system for monitoring the connection of the terminals of at least one battery which is suitable to be connected and provide auxiliary electrical power to an onboard electrical distribution system of a motor vehicle, the monitoring system comprising:

- an electronic control unit;
- a sensor which is adapted to be connected to at least one of the terminals of the battery and to provide in input to said electronic control unit signals indicative of the electric power currently generated by the battery;

wherein the electronic control unit is configured, based on said signals received in input:

- to monitor and compare at least one electrical parameter of the electric power currently generated by the battery with at least one predefined reference condition which is indicative, relative to the monitored electrical parameter, of a correct connection of the terminals to the onboard electrical distribution system; and
- to output an alert signal indicative of an incorrect connection of at least one of the terminals of the battery to the onboard electrical distribution system when the at least one electrical parameter monitored exceeds said predetermined reference condition.

According to some aspects, the monitoring system according to the present disclosure may comprise one or more of the following features, which may be combined in any technical feasible combination:

- the electronic control unit is configured to monitor the profile of the current outflowing from the battery and to output said alert signal if, within a predefined interval of time, the electronic control unit detects that a negative current peak alternates in sequence with a positive current peak, or vice versa, for at least a predetermined number of times, a negative or positive current peak being reached when a value of the monitored current exceeds a corresponding predefined current peak threshold;
- the onboard electrical distribution system of the motor vehicle comprises an alternator, and wherein the electronic control unit is configured to monitor and compare the profile of the voltage at the terminals of the battery with the profile of the voltage at the terminals of the alternator, and to output said alert signal if, within a predefined interval of time, the profile of the voltage at the terminals of the battery differs from the profile of the voltage at the terminals of the alternator for at least a predefined threshold quantity.

This aim is also achieved by a method for monitoring the connection of the terminals of at least one battery which is suitable to be connected and provide auxiliary electrical power to an onboard electrical distribution system of a motor vehicle, the method comprising:

- (a): providing in input to an electronic control unit, by means of a sensor which is adapted to be connected to at least one of the terminals of the battery signals indicative of the electric power currently generated by the battery;
- (b): monitoring and comparing, by means of the electronic control unit, based on said signals received in input, at least one electrical parameter of the electric power currently generated by the battery with at least one predetermined reference condition, which is indicative, relative to the monitored electrical parameter, of a correct connection of the terminals to the onboard electrical distribution system; and (c): outputting, by means of the electronic control unit, an alert signal indicative of an incorrect connection of at least one of the terminals of the battery to the onboard electrical distribution system when the at least one electrical parameter exceeds said predetermined reference condition.

According to some aspects, the method according to the present disclosure may comprise one or more of the following:

the (b) monitoring and comparing comprises monitoring the current outflowing from the battery and the (c) outputting comprises outputting said alert signal if, within a predefined interval of time, there is detected that a negative current peak alternates in sequence with a positive current peak, or vice versa, for at least a predetermined number of times, a negative or positive current peak being reached when a value of the monitored current exceeds a corresponding predefined current peak threshold;

the (b) comparing comprises monitoring and comparing the profile of the voltage at the terminals of the battery with the profile of the voltage at the terminals of an alternator of the motor vehicle, and wherein said step of outputting comprises outputting said alert signal if, within a predefined interval of time, the profile of the voltage at the terminals of the battery differs from the profile of the voltage at the terminals of the alternator for at least a predefined threshold quantity.

Further, the aim of the present disclosure is also achieved by a motor vehicle comprising a system for monitoring the connection of the terminals of at least one battery which is suitable to be connected and provide auxiliary electrical power to an onboard electrical distribution system of the motor vehicle, wherein the monitoring system comprises:

an electronic control unit;

a sensor which is adapted to be connected to at least one of the terminals of the battery and to provide in input to said electronic control unit signals indicative of the electric power currently generated by the battery;

wherein the electronic control unit is configured, based on said signals received in input:

to monitor and compare at least one electrical parameter of the electric power currently generated by the battery with at least one predefined reference condition which is indicative, relative to the monitored electrical parameter, of a correct connection of the terminals to the onboard electrical distribution system; and to output an alert signal indicative of an incorrect connection of at least one of the terminals of the battery to the onboard electrical distribution system when the at least one electrical parameter monitored exceeds said predetermined reference condition.

In addition, the aim of the present disclosure is also achieved by a motor vehicle comprising a system for monitoring the connection of the terminals of at least one battery which is suitable to be connected and provide auxiliary electrical power to an onboard electrical distribution system of the motor vehicle, wherein the monitoring system comprises:

an electronic control unit;

a sensor which is adapted to be connected to at least one of the terminals of the battery and to provide in input to said electronic control unit signals indicative of the electric power currently generated by the battery;

wherein the electronic control unit is configured, based on said signals received in input:

to monitor and compare at least one electrical parameter of the electric power currently generated by the battery with at least one predefined reference condition which is indicative, relative to the monitored electrical parameter, of a correct connection of the terminals to the onboard electrical distribution system; and to output an alert signal indicative of an incorrect connection of at least one of the terminals of the battery to the onboard electrical distribution system when the at least one electrical parameter monitored exceeds said predetermined reference condition.

BRIEF DESCRIPTION OF THE DRAWINGS

Further characteristics and advantages will become apparent from the description of some preferred but not exclusive exemplary aspects of a system and a method according to the present disclosure, illustrated only by way of non-limitative examples with the accompanying drawings, wherein.

DETAILED DESCRIPTION

Figure 1:
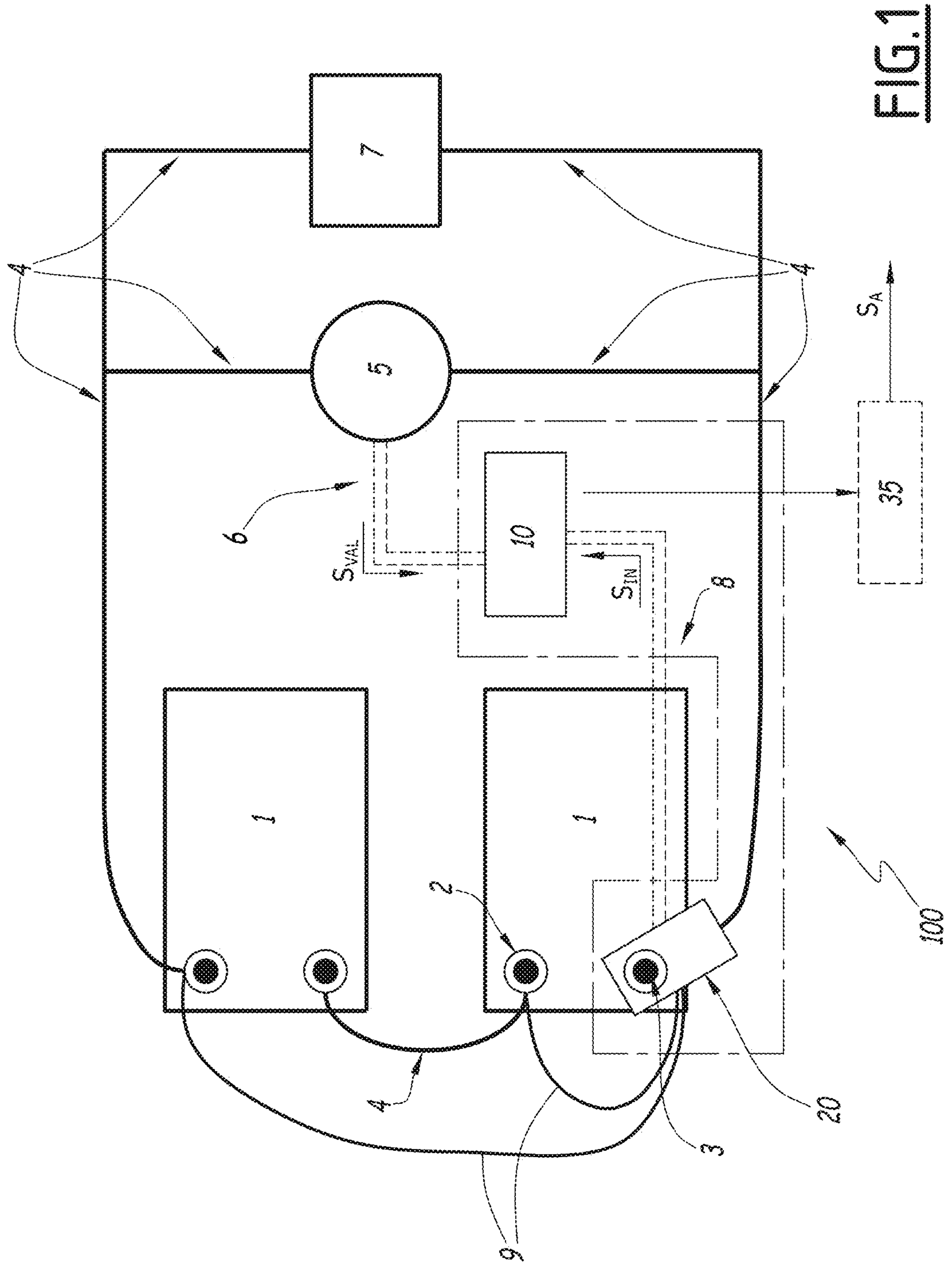
FIG. 1 is block diagram schematically illustrating a system for monitoring the connection of the terminals of at least one battery to an onboard electrical distribution system of a motor vehicle, according to the present disclosure.

It should be noted that in the detailed description that follows, identical or similar components, either from a structural and/or functional point of view, may have the same reference numerals, regardless of whether they are shown in different examples of the present disclosure; it should also be noted that in order to clearly and concisely describe the present disclosure, the drawings may not necessarily be to scale and certain features of the disclosure may be shown in somewhat schematic form.

Further, when the term "adapted" or "arranged" or "configured" or "shaped", or "set" or any equivalent or similar term is used herein while referring to any component as a whole, or to any part of a component, or to a combination of components, it has to be understood that it means and encompasses correspondingly either the structure, and/or configuration and/or form and/or positioning of the related component or part thereof, or combinations, such term refers to.

In particular, for electronic and/or software means, each of the above listed terms means and encompasses electronic circuits or parts thereof, as well as stored, embedded or running software codes and/or routines, algorithms, or complete programs, suitably designed for achieving the technical result and/or the functional performances for which such means are devised.

FIG. 1 schematically illustrates a system 100 for monitoring the connection of the terminals of at least one battery 1 which is suitable to be connected and provide auxiliary electrical power to an onboard electrical distribution system of a motor vehicle.

As also schematically illustrated in the example of FIG. 1, the onboard electrical distribution system of a motor vehicle comprises an alternator 5 which is suitable to provide electric power to various electrical loads or consumers installed onboard of the motor vehicle itself.

These loads are schematically represented in FIG. 1 by the reference number 7 and can be constituted by any suitable type of electric/electronic onboard device, apparatus or system that need to be powered.

Clearly, as those skilled in the art would readily appreciate, in addition to the alternator 5 and depending on the applications, the onboard electrical distribution system may have various parts, branches and components mutually organized according to network architectures per se known or readily available and will not be described herein in details.

Further, in the example illustrated there are represented two batteries 1, e.g. two 12V batteries, which are cabled, to each other and to the alternator 5 and the loads 7, via cables 4.

Clearly, also the number of batteries 1 used can be any suitable one according to the applications and in order to form a desired onboard battery pack.

Therefore, in the following reference will be made for ease of illustration to the terminals 2 and 3 of the lower battery 1 represented in FIG. 1; the system 100 according to the disclosure is suitable for monitoring all terminals of the batteries used, in order to detect a bad connection and prevents a disconnection of any of them, in the way that will be described in more details hereinafter.

The monitoring system 100 according to the disclosure, which is suitable to be mounted on board of the vehicle, comprises at least:

- an electronic control unit, schematically represented in FIG. 1 by the reference number 10; and
- a sensor unit, schematically indicated in FIG. 1 by the reference number 20, which is adapted to be connected to at least one of the terminals, e.g. the terminal 3 of a battery 1, and is in operative communication with the electronic control unit 10, for instance also via a wired connection 8.

The electronic control unit 10 to which it is referred to above is not necessarily made of one single unit. Rather, it can be made of several units connected with each other, which means that the ECU 10 can be considered as a control system or controller and is not limited to one single box containing some electronic components.

In particular, the sensor 20 is configured to provide in input to the electronic control unit 10 signals $S_{IN}$ indicative of the evolution of the electric power currently generated, i.e. in real time, by the battery(ies) 1.

For instance, such sensor 20 can comprise or be constituted by any suitable current and/or voltage sensor, and can be connected to and monitor all terminals of the batteries 1, for example via cables 9 as schematically represented in FIG. 1.

In turn, the electronic control unit 10 can be constituted by or comprise any suitable signal processor-based device, e.g. a processor of a type commercially available, suitably programmed and provided to the extent necessary with circuitry and algorithms in order to perform the innovative functionalities devised for the system 100 according to the present disclosure as hereinafter described.

Although in FIG. 1 the electronic control unit 10 and the sensor 20 are depicted as separate components, they can be operatively associated together to form and be installed on board on the vehicle as a whole unique unit.

Usefully, in the monitoring system 100 according to the present disclosure, the electronic control unit 10 is configured, based on the signals $S_{IN}$ received in input from the sensor 20:

- first to monitor and compare at least one electrical parameter of the electric power currently generated by the battery 1 with at least one predetermined reference condition which is indicative, relative to the monitored electrical parameter, of a correct connection of the terminals 2, 3 to the onboard electrical system of the motor vehicle; and then
- to output an alert signal $S_A$ indicative of an incorrect connection of at least one of the terminals 2, 3 of the battery 1 to the onboard electrical system, only when the at least one electrical parameter monitored exceeds the predetermined reference condition.

The predetermined reference condition is indicative of a reference boundary or limit condition which, if exceeded, indicates that there is an incorrect connection of any of the terminals of the battery(ies) monitored.

As represented in FIG. 1, the alert signal $S_A$ can be routed to an onboard main control unit, schematically represented in FIG. 1 by the reference number 35; in turn, the main control unit 35 may issue a corresponding alert to the attention of a driver in any suitable manner, for example by means of a warning light lit on the instrument panel of the vehicle.

In one possible aspect, the electronic control unit 10 is configured to monitor the current outflowing from the battery 1, e.g. its profile or evolution over the time, and to output said alert signal $S_A$ only if:

- the electronic control unit 10 detects first that a negative current peak is followed by a positive current peak (or vice versa) within a predefined first interval of time T1; and, after this first condition is verified to occur, then:
- the electronic control unit 10 verifies that a negative current peak alternates in sequence with a subsequent positive current peak (or vice versa) for at least a predetermined number of times within a predefined second interval of time T2.

In particular, a negative or positive current peak is considered reached each time a value of the monitored current exceeds a corresponding predefined threshold $T_H$.

Figure 3:
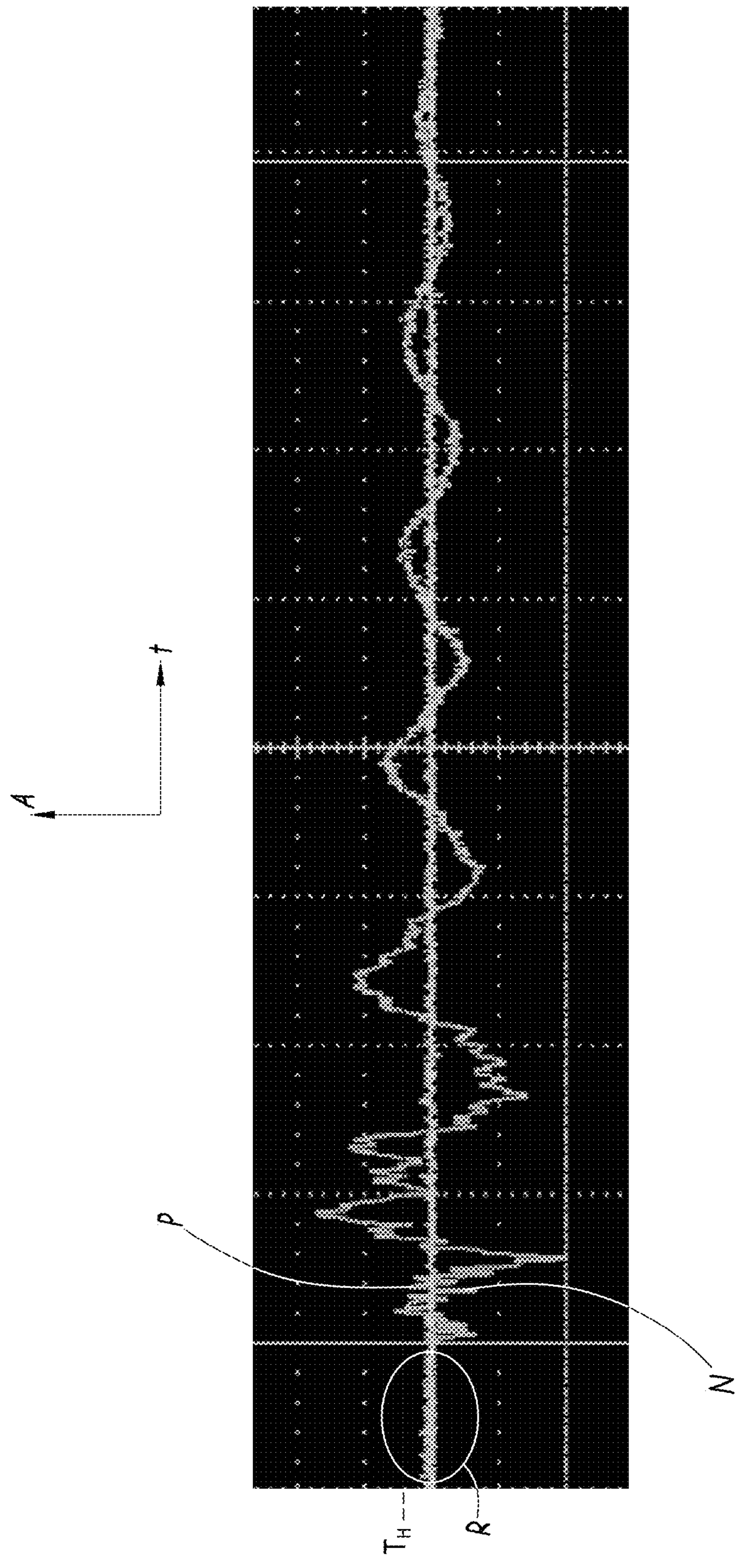
FIG. 3 is a graph schematically showing the profile of the current outflowing from the terminals of a battery when at least one terminal of the battery is not correctly connected to the onboard electrical system of the motor vehicle.

For the sake of ease of illustration, in FIG. 3 only an upper or positive peak current threshold is represented with a horizontal dotted line $T_H$; clearly, a corresponding lower or negative current peak threshold can be likewise defined, and the two positive and negative current peak thresholds can have the same absolute value, or two respective and different values.

Conveniently, the or each predefined current peak threshold $T_H$ above indicated can be suitably chosen to discard oscillations of the current signal that usually occur due to vibrations, and which oscillations represent just background noise. In this way, it is possible to avoid untimely and erroneous warning signals.

For example, the specific value of the or each predefined current peak threshold can be properly set depending on the specific applications, and in particular in relation with the capacity of the battery(ies) 1 used.

In practice, according to this example, the electronic control unit 10, via the signals provided by the sensor 20, substantially continuously first detects if a negative current peak (one of which is indicated in FIG. 3 by way of example with the letter N) is followed by a positive current peak (one of which is also indicated in FIG. 3 by way of example with the letter P) within a short interval of time T1; if so, the electronic control unit 10 verifies if an alternated sequence negative peak N-positive peak P and then negative peak N-positive peak P et cetera, is repeated for at least a predetermined number of times within a predefined longer interval of time T2. If also this second condition is verified, then the electronic control unit 10 issues the alert signal $S_A$.

Clearly, the vice versa is likewise valid and applicable, namely the electronic control unit 10 substantially continuously first detects if a positive current peak is followed by a negative current peak and then followed again by a new positive current peak, et cetera.

In this way, the alternance in sequence of negative current peaks with corresponding positive current peaks (or vice versa) indicates an actual trend of the profile of the current monitored within the interval of time defined which is significantly different from a regular trend (illustrated by the portion of the curve R in FIG. 3) experienced when the current peaks are due just to normal consumption of supplied loads.

The shape of the curve deviating from the reference condition represented by the portion R and that in normal condition should instead continue as such, reflects the occurrence of an electrical arcing effect which indicates the presence of a battery terminal incorrectly or badly connected when the alternate sequence is repeated (within the predefined time interval considered) for at least the predetermined number of times.

The time intervals T1 and T2, as well as the number of events repeated, i.e. the occurrence of an alternate sequence between a positive peak followed by a negative peak (or vice versa) can be selected also according to the specific applications. For example, the threshold/trigger could be the occurrence of 10 events in less than 10 seconds.

In particular, the electronic control unit 10 is suitably configured to selectively set the predefined first interval of time and the predefined second interval of time.

The predefined second interval of time T2 is conveniently set to be being longer than the first interval of time T1 in order to properly balance the need of properly identifying a bad connection of a terminal with that of avoiding untimely and incorrect alerts.

For instance, in case of a truck when two batteries 1 are used as depicted in the example of FIG. 1, then the predetermined positive peak current threshold $T_H$ can be equal to or greater than 50 A, the time interval T1 can be set to be equal to or shorter than 0.5 ρs, and the time interval T2 can be about 10 s. As above indicated, the absolute value for the negative current peak threshold can be for instance the same or a different one.

In an alternative example, the electronic control unit 35 can provide the value for the current peak threshold(s). This value is coded as a parameter in software algorithm and can be modified manually using a specific engineering tool (e.g., On-Board diagnostic tool) to be connected to ECU 35.

According to yet another example, the electronic control unit 10 receives, for example via the connection 6, also signals $S_{VAL}$ indicative of the voltage generated at the terminals the alternator 5.

The voltage generated at the terminals of the alternator 7 can properly vary depending on the applications; for example, for a truck it can range between 26V and 32V.

Figure 4:
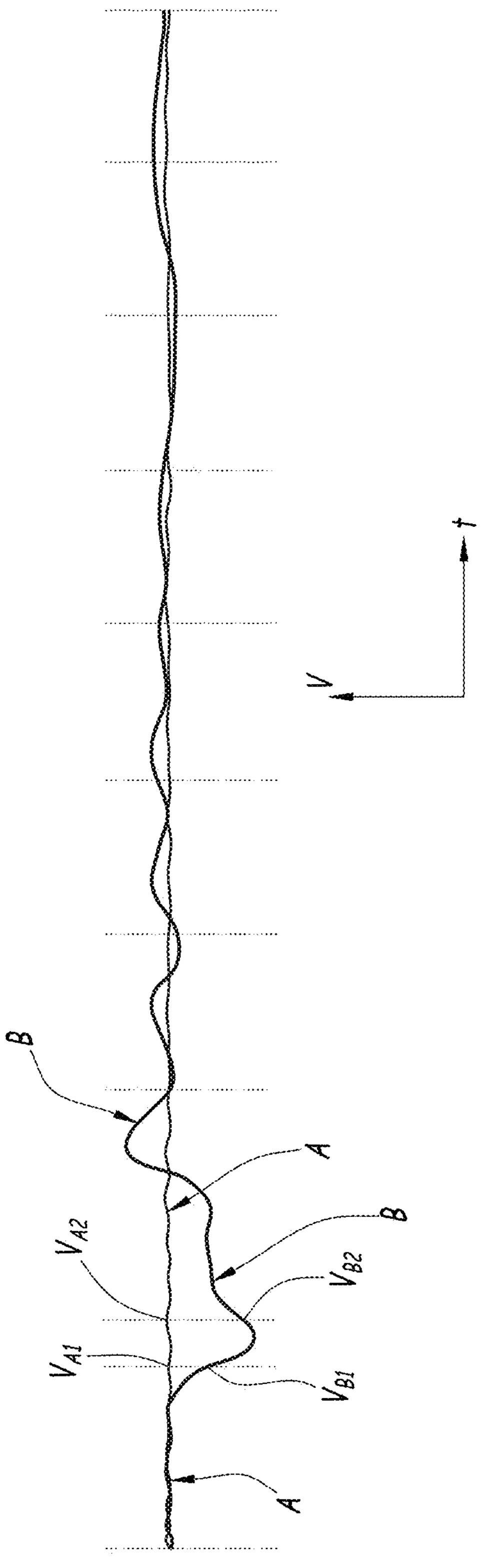
FIG. 4 is a graph schematically comparing the profile of the voltage at the terminals of a battery with the voltage at the terminals of the alternator of the motor vehicle, when at least one terminal of the battery is not correctly connected to the onboard electrical system of the motor vehicle.

Conveniently, the electronic control unit 10 is configured to monitor and compare the profile of the voltage at the terminals 2, 3 of the battery 1 (indicated in FIG. 4 by the capital letter A) with the profile of the voltage at the terminals of the alternator 5 (indicated in FIG. 4 by the capital letter B), and to output an alert signal $S_A$ if, within a predefined interval of time T3 similar to T2, the profile of the voltage at the terminals 2, 3 of the battery 1 differs from the profile of the voltage at the terminals of the alternator 5 for at least a predefined threshold quantity.

Also in this case, the predefined threshold quantity represents the predetermined reference condition indicative of a reference boundary or limit condition for concluding that there is a correct connection of the terminals 2, 3 and can be properly selected based on the applications.

For example, this reference threshold can be expressed as a percentage relative to the voltage generated at the terminals of the alternator 5 taken as reference.

For example, such difference can be defined as the 10% of the reference value; thus, for instance, a predefined number of actual values of the voltage generated at the terminal of a battery 1 at respective instants of time (see representative point $V_{B1}$, $V_{B2}$ on the curve B) should not differ of about 10% (or more) from the corresponding reference values of the voltage generated at the terminals of the alternator 5 taken at the same instants of time (see representative point $V_{A1}$, $V_{A2}$ on the curve A).

Conveniently, the electronic control unit 10 can be configured to implement one or both the above indicated monitoring and comparing criteria of the described examples, which can be used in alternative or in addition to each other.

For example, the electronic control unit 10 can be configured to check if, within a predefined first interval of time T1, a first negative current peak is followed by a first positive current peak, and thereafter if a plurality of negative and positive current peaks of the monitored current, exceeding the predefined current peak threshold $T_H$, alternate in sequence to each other for a predetermined number of times within the second time interval T2, and also to check if, within a predefined interval of time, the profile of the voltage at the terminals 2, 3 of the battery 1 differs from the profile of the voltage at the terminals of the alternator 5 for the predefined quantity.

Then, the electronic control unit 10 can be set to selectively execute one of the above examples described and then to output the related alert signal $S_A$ only if the corresponding predefined reference condition is exceeded, or if desired or selected, to implement both examples and to output the alert signal if both the corresponding predefined reference conditions are exceeded.

Figure 2:
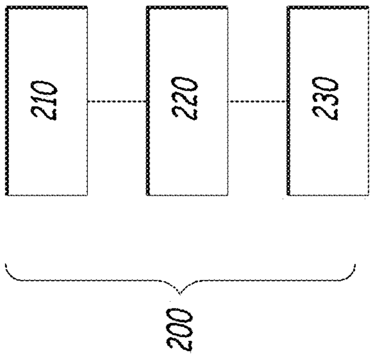
FIG. 2 is a flow diagram schematically representing a method for monitoring the connection of the terminals of at least one battery to an onboard electrical distribution system of a motor vehicle, according to the present disclosure.

FIG. 2 illustrates a method 200 for monitoring the connection of the terminals 2, 3 of at least one battery 1 which is suitable to be connected and provide auxiliary electrical power to an onboard electrical system of a motor vehicle, which can be implemented in connection with and/or using for example the system 100 previously described.

In particular, the method 200 comprises at least the following steps:

210: providing in input to an electronic control unit, e.g. the electronic unit 10, by means of a sensor 20 which is adapted to be connected to at least one of the terminals 3 of the battery 1, signals $S_{IN}$ indicative of the electric power currently generated by the battery 1;

220: monitoring and comparing, by means of the electronic control unit 10, and based on the signals $S_{IN}$ received in input, at least one electrical parameter of the electric power currently generated by the battery 1 with at least one predetermined reference condition which is indicative, relative to the monitored electrical parameter, of a correct connection of the terminals 2, 3 to the onboard electrical system; and

230: outputting, by means of the electronic control unit 10, an alert signal $S_A$ indicative of an incorrect connection of at least one of the terminals 2, 3 of the battery 1 within the onboard electrical system when the at least one electrical parameter exceeds said exceeds said predetermined reference condition.

In one possible aspect, the step 220 comprises monitoring the profile or evolution of the current outflowing from the battery 1.

Accordingly, the step 220 comprises:

detecting, by means of the electronic control unit 10 and based on the signals $S_{IN}$ received in input, if a negative current peak is followed by a positive current peak (or vice versa) within a predefined first interval of time T1; and, after this first condition is verified to occur, then:

verifying, by means of the electronic control unit 10 and based on the signals $S_{IN}$ received in input, that a negative current peak alternates in sequence with a subsequent positive current peak (or vice versa) for at least a predetermined number of times within a predefined second interval of time T2.

If also this second condition is verified, then step 230 is executed by outputting the alert signal $S_A$.

As previously mentioned, a negative or positive current peak is considered reached when a value of the monitored current exceeds a corresponding predefined current peak threshold $T_H$.

Usefully, according to another possible aspect, the step 220 comprises monitoring and comparing the profile of the voltage at the terminals 2, 3 of the battery 1 with the profile of the voltage at the terminals of the alternator 5 of the motor vehicle.

According to this aspect, the step 230 comprises outputting the alert signal $S_A$ if, within a predefined interval of time T3, the profile of the voltage at the terminals 2, 3 of the battery 1 differs from the profile of the voltage at the terminals of the alternator 5 for more than a predefined threshold quantity, which can be for example of about 10% as previously indicated.

Hence, it is evident from the foregoing description that the monitoring system 100 and method 200 according to the present disclosure allow achieving the intended aim since they are capable of timely identifying if any terminal of a battery is not properly connected to the onboard electrical distribution system, thus giving the possibility of alerting a driver of such potentially dangerous condition before the badly connected terminal disconnects completely.

These results are achieved according to a solution very easy to be realized and installed at competitive costs, and which can be used in principle with any type of motor vehicles, and in particular of trucks.

The monitoring system 100 and method 200 thus conceived are susceptible of modifications and variations, all of which are within the scope of the inventive concept as defined in particular by the appended claims. For example, the time interval(s) and predefined threshold or threshold quantity can be properly set and/or modified according to the specific needs, et cetera.

All the details may furthermore be replaced with technically equivalent elements.

The invention claimed is:

1. A system for monitoring a connection of terminals of at least one battery which is suitable to be connected and provide auxiliary electrical power to an onboard electrical distribution system of a motor vehicle, the monitoring system being comprising:

an electronic control unit;

a sensor which is adapted to be connected to at least one of the terminals of the at least one battery and to provide an input to said electronic control unit as signals indicative of the auxiliary electrical power currently generated by the at least one battery; wherein the electronic control unit is configured, based on said signals received in input:

to monitor and compare at least one electrical parameter of the auxiliary electrical power currently generated by the at least one battery with at least one predefined reference condition which is indicative, relative to the monitored at least one electrical parameter, of a correct connection of the terminals to the onboard electrical distribution system; and to output an alert signal indicative of an incorrect connection of at least one of the terminals of the at least one battery to the onboard electrical distribution system when the at least one electrical parameter monitored exceeds said at least one predefined reference condition, wherein the electronic control unit is configured to monitor a profile of a current outflowing from the at least one battery and to output said alert signal only if:

the electronic control unit detects first that a negative current peak is followed by a positive current peak or vice versa within a predefined first interval of time; and, after this first condition is verified to occur, and then:

the electronic control unit verifies that a negative current peak alternates in sequence with a subsequent positive current peak or vice versa for at least a predetermined number of times within a predefined second interval of time, the negative or positive current peak being reached when a value of the monitored current exceeds a corresponding predefined current peak threshold.

2. The system according to claim 1, wherein the electronic control unit is configured to selectively set the predefined first interval of time and the predefined second interval of time, the predefined second interval of time being longer than the predefined first interval of time.

3. The system according to claim 1, wherein the onboard electrical distribution system of the motor vehicle comprises an alternator, and wherein the electronic control unit is configured to monitor and compare a profile of a voltage at the terminals of the at least one battery with the profile of the voltage at terminals of the alternator, and to output said alert signal if, within a predefined interval of time, the profile of the voltage at the terminals of the at least one battery differs from the profile of the voltage at the terminals of the alternator for at least a predefined threshold quantity.

4. A motor vehicle comprising an onboard electrical distribution system, the at least one battery which is suitable to be connected and provide the at least one auxiliary electrical power to the onboard electrical distribution system, the motor vehicle comprising the monitoring system according to claim 1.

5. A truck comprising an onboard electrical distribution system, the at least one battery which is suitable to be connected and provide the auxiliary electrical power to the onboard electrical system, the truck comprising the monitoring system according to claim 1.

6. A method for monitoring a connection of the terminals of at least one battery which is suitable to be connected and provide auxiliary electrical power to an onboard electrical distribution system of a motor vehicle, the method comprising:

providing in input to an electronic control unit, by means of a sensor which is adapted to be connected to at least one of the terminals of the at least one battery as signals indicative of the auxiliary electrical power currently generated by the at least one battery;

monitoring and comparing, by means of the electronic control unit, based on said signals received in input, at least one electrical parameter of the auxiliary electrical power currently generated by the at least one battery with at least one predetermined reference condition, which is indicative, relative to the monitored at least one electrical parameter, of a correct connection of the terminals to the onboard electrical distribution system; and outputting, by means of the electronic control unit, an alert signal indicative of an incorrect connection of at least one of the terminals of the at least one battery to the onboard electrical distribution system when the at least one electrical parameter exceeds said at least one predetermined reference condition, wherein said monitoring and comparing comprises monitoring a current outflowing from the at least one battery and detecting first if a negative current peak is followed by a positive current peak, or vice versa, within a predefined first interval of time; and, after this first condition is detected to occur, then verifying, as a second condition, that a negative current peak alternates in sequence with a subsequent positive current peak, or vice versa, for at least a predetermined number of times within a predefined second interval of time, the negative or positive current peak being reached when a value of the monitored current exceeds a corresponding predefined current peak threshold, and wherein said outputting comprises outputting said alert signal only when also said second condition is verified to occur.

7. The method according to claim 6, wherein said monitoring and comparing comprises monitoring and comparing a profile of the voltage at the terminals of the at least one battery with the profile of the voltage at terminals of an alternator of the motor vehicle, and wherein said outputting comprises outputting said alert signal if, within a predefined interval of time, the profile of the voltage at the terminals of the at least one battery differs from the profile of the voltage at the terminals of the alternator for at least a predefined threshold quantity.

* * * * *